United States Patent
Taira

[11] Patent Number: 6,049,477
[45] Date of Patent: Apr. 11, 2000

[54] FERROELECTRIC MEMORY DEVICE IN WHICH THE CHANNEL REGION HAS THE SAME CONDUCTIVITY TYPE AS THE DIFFUSION REGION

[75] Inventor: Shigenobu Taira, Kawasaki, Japan

[73] Assignee: Fujitsu Limited, Kawasaki, Japan

[21] Appl. No.: 09/111,753

[22] Filed: Jul. 8, 1998

[30] Foreign Application Priority Data

Dec. 9, 1997 [JP] Japan .................................... 9-338756

[51] Int. Cl.⁷ .................................................... G11C 11/22
[52] U.S. Cl. ............................................ 365/145; 257/295
[58] Field of Search .................................... 365/145, 117, 365/149, 185.01; 257/295, 310

[56] References Cited

U.S. PATENT DOCUMENTS

| | | | |
|---|---|---|---|
| 3,426,255 | 2/1969 | Heywang | 317/235 |
| 5,365,094 | 11/1994 | Takasu | 257/295 |
| 5,449,935 | 9/1995 | Nakamura | 257/295 |
| 5,523,964 | 6/1996 | McMillan | 365/145 |
| 5,623,439 | 4/1997 | Gotoh et al. | 365/145 |
| 5,633,821 | 5/1997 | Nishimura | 365/145 |
| 5,768,185 | 6/1998 | Nakamura | 365/185.01 |
| 5,877,977 | 3/1999 | Essaian | 365/145 |

FOREIGN PATENT DOCUMENTS

| | | |
|---|---|---|
| 0 767 464 A2 | 4/1997 | European Pat. Off. . |
| 5-326974 | 12/1993 | Japan . |
| 9-27191 | 1/1997 | Japan . |

OTHER PUBLICATIONS

Prins M W J et al: "Depletion–Type Thin–Film Transistors With A Ferroelectric Insulator" Applied Physics Letters, vol. 70, No. 4, Jan. 27, 1997, pp. 458–460, XP000680623 (p. 459, col. 1, line 5—line 9; figure 2).

Yukio Watanabe: "Epitaxial All–Perovskite Ferroelectric Field Effect Transistor With A Memory Retention" Applied Physics Letters, vol. 66, No. 14, Apr. 3, 1995, pp. 1770–1772, XP000500955 (figure 1).

*Primary Examiner*—Son Mai
*Attorney, Agent, or Firm*—Armstrong, Westerman, Hattori, McLeland & Naughton

[57] ABSTRACT

A ferroelectric memory device includes a channel region formed in a substrate having a first conductivity type, a first diffusion region formed in the substrate at a first side of the channel region with a second, opposite conductivity type, a second diffusion region formed in the substrate at a second side of said channel region with the second conductivity type, a ferroelectric film formed on the substrate so as to cover the channel region, and a gate electrode provided on the ferroelectric film, wherein the channel region has the second conductivity type.

9 Claims, 8 Drawing Sheets

FERROELECTRIC MEMORY DEVICE IN WHICH THE CHANNEL REGION HAS THE SAME CONDUCTIVITY TYPE AS THE DIFFUSION REGION

BACKGROUND OF THE INVENTION

1. Field of the Invention

The present invention generally relates to semiconductor devices and more particularly to a ferroelectric memory device and a driving method thereof.

2. Description of the Related Art

A ferroelectric memory device is a semiconductor device having a MISFET structure and stores information in the form of spontaneous polarization of a ferroelectric material such as PZT ($PbZnTiO_3$). Thus, a ferroelectric memory device realizes a high-speed, non-volatile storage of information. In a ferroelectric memory device, it is further possible to conduct a writing of information with a commonly used supply voltage of 3.3V or 5 V, while this feature is a significant advantage over a flash memory device that requires a voltage of as high as 10–20 V for writing information. Particularly, the ferroelectric memory device of the so-called MFS (metal-ferroelectric-semiconductor) FET, which has a simple construction in that only a single MISFET is used in a memory cell, is suitable for constructing a large storage-capacity non-volatile semiconductor memory integrated circuit by integrating the FETs with a large integration density.

Meanwhile, the inventor of the present invention has proposed a novel ferroelectric memory cell transistor in the Japanese Laid-open Patent Publication 9-82905.

FIG. 1 shows the construction of a ferroelectric memory cell transistor 20 according to the foregoing prior art.

Referring to FIG. 1, the ferroelectric memory cell transistor 20 is formed on a Si substrate 21 and includes a p-type well 22 formed on the Si substrate 21, $n^+$-type diffusion regions 22A and 22B formed in the p-type well 22 as the diffusion region of the MFS-FET, and a channel region 22C formed in the well 22 between the diffusion regions 22A and 22B as the channel region of the MFS-FET.

Further, the memory cell transistor 20 includes a floating electrode 23B of Pt, and the like, on the channel region 22C, with an $SiO_2$ film 23A intervening between the floating electrode 23B and the surface of the well 22, and a ferroelectric film 23C of PZT, and the like, is formed on the floating electrode 23B. The ferroelectric film 23C carries thereon a gate electrode 23D of polysilicon, and the like. Thereby, the device of FIG. 1 constitutes a MFS-FET having a PZT film for storage of information.

Further, the gate electrode 23D is connected to a word line WL and the diffusion region 22A is connected to a bit line BL, wherein it should be noted that the bit line BL is connected also to the well itself in the foregoing conventional example of FIG. 1. Further, the construction of FIG. 1 includes a p-type diffusion region 22D in the diffusion region 22B and the diffusion region 22B forms a part of the diode.

FIG. 2 shows the circuit diagram of the ferroelectric memory device that uses the ferroelectric memory cell transistor 20 of FIG. 1.

Referring to FIG. 2, there is provided a word line $WL_0$ selected by a row selection transistor Row such that the word line $WL_0$ is connected to a gate electrode corresponding to the gate electrode 23D of FIG. 1 and such that the word line $WL_0$ is also connected to the diffusion region 22B via a diode formed by the p-type diffusion region 22B of FIG. 1. Further, a bit line $BL_0$ is connected to the diffusion region 22A of FIG. 1 and further to a sense amplifier S/A via a column selection transistor Col. It should be noted that there are provided a word line $WL_1$ and a bit line $BL_1$ adjacent to the word line $WL_0$ and $BL_0$ and a memory cell transistor not shown is connected to the word line $WL_1$ and $BL_1$ similarly to the memory cell transistor 20.

In the construction of FIG. 2, a writing of information into the memory cell transistor 20 is conducted by selecting the word line $WL_0$ and the bit line $BL_0$ via the row selection transistor Row and the column selection transistor Col and by applying a write voltage across the gate electrode 23D and the p-type well 22. As a result, the information is recorded in the ferroelectric film 23B in the form of spontaneous polarization.

When reading information, the word line $WL_0$ is selected by the row selection transistor Row and a read voltage is applied to the gate electrode 23D. Simultaneously, the read voltage is applied to the diffusion region 22B of the memory cell transistor 20 via a diode formed by the diffusion regions 22B and 22D. Thus, the voltage appearing on the bit line $BL_0$, which is selected by the column selection transistor Col, is detected by the sense amplifier S/A cooperating with the bit line $BL_0$.

In the memory cell transistor 20 of FIG. 1, it should be noted that the bit line BL has to be connected to the p-type well 22, and thus, there is provided a contact hole exposing the p-type well in an insulation film (not shown) that covers the memory cell transistor 20, adjacent to the diffusion region 22A. However, such an additional contact hole causes an increase in the area of the memory cell transistor and decreases the integration density of the ferroelectric memory integrated circuit formed by integrating the memory cell transistors 20. In relation to the integration of the memory cell transistors, it should be noted that the construction of FIG. 1 requires the well 22 that acts as a device isolation structure.

SUMMARY OF THE INVENTION

Accordingly, it is a general object of the present invention to provide a novel and useful ferroelectric memory device and a driving method thereof wherein the foregoing problems are eliminated.

Another and more specific object of the present invention is to provide a ferroelectric memory device having a simple structure and is capable of conducting writing and reading of information to and from the ferroelectric memory device with reliability.

Another object of the present invention is to provide a ferroelectric memory device, comprising:

a substrate having a first conductivity type;

a channel region formed in said substrate;

a first diffusion region formed in said a substrate at a first side of said channel region, said first diffusion region having a second, opposite conductivity type;

a second diffusion region formed in said substrate at a second side of said channel region, said second diffusion region having said second conductivity type;

a ferroelectric film formed on said substrate so as to cover said channel region; and a gate electrode provided on said ferroelectric film;

wherein said channel region has said second conductivity type.

Another object of the present invention is to provide a flash memory, comprising:

a memory cell transistor comprising a substrate having a first conductivity type; a channel region formed in said substrate; a first diffusion region formed in said substrate at a first side of said channel region, said first diffusion region having a second, opposite conductivity type; a second diffusion region formed in said substrate at a second side of said channel region, said second diffusion region having said second conductivity type; a ferroelectric film formed on said substrate so as to cover said channel region; and a gate electrode provided on said ferroelectric film; said channel region having said second conductivity type;

an erase control line connected to said gate electrode;

a power supply line connected to said first diffusion region;

a selection transistor connected between said second diffusion region and a bit line; and a word line connected to a gate electrode of said selection transistor.

Another object of the present invention is to provide a non-volatile random access memory, comprising:

a memory cell transistor comprising: a substrate having a first conductivity type; a channel region formed in said substrate; a first diffusion region formed in said substrate at a first side of said channel region, said first diffusion region having a second, opposite conductivity type; a second diffusion region formed in said substrate at a second side of said channel region, said second diffusion region having said second conductivity type; a ferroelectric film formed on said substrate so as to cover said channel region; and a gate electrode provided on said ferroelectric film; said channel region having said second conductivity type;

a first word line connected to said gate electrode;

a power supply line connected to said first diffusion region;

a selection transistor connected between said second diffusion region and a bit line;

a second word line connected to a gate electrode of said selection transistor;

a latch circuit connected to said bit line; and a data transfer circuit for transferring data held in said latch circuit to said bit line.

According to the present invention, it becomes possible to apply an electric field to the ferroelectric film from the diffusion region via the channel region, by doping the channel region to the same conductivity type of the diffusion regions formed at both lateral sides of the channel region. Thereby, it is no longer necessary to apply a bias voltage to the semiconductor substrate or to the well formed in the semiconductor substrate, and the electrode used conventionally for biasing the substrate or the well can be removed without problem. Associated with this, it is also possible to eliminate the well itself. Thereby, the size of the ferroelectric memory device can be reduced.

Other objects and further features of the present invention will become apparent from the following detailed description when read in conjunction with the attache drawings.

DETAILED DESCRIPTION OF THE PREFERRED EMBODIMENTS

PRINCIPLE

Figure 3:
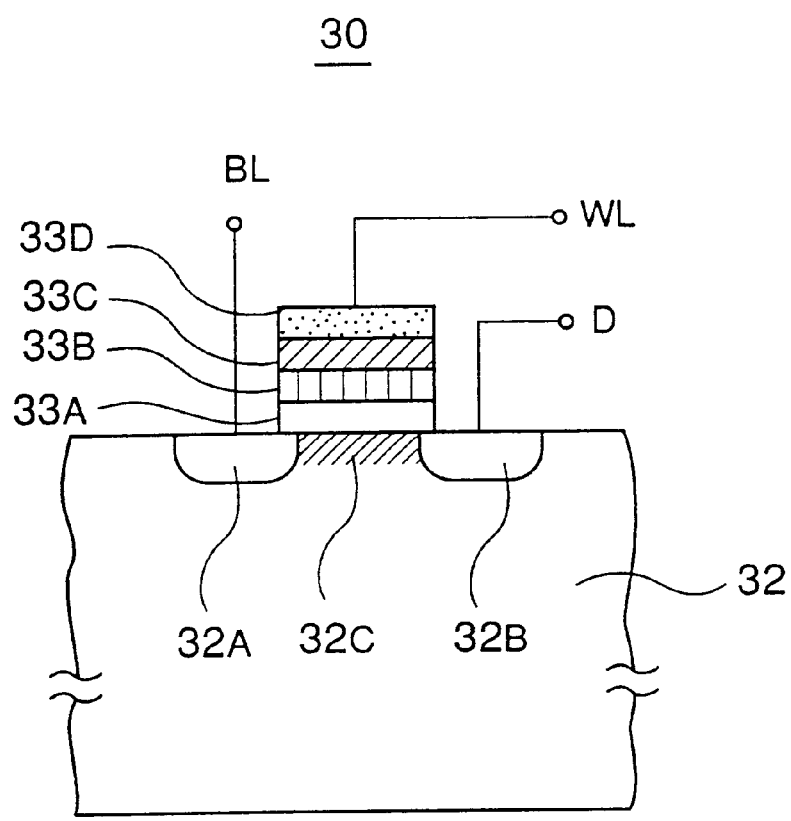
FIG. 3 is a diagram showing the principle of the present invention.

FIG. 3 shows the principle of a ferroelectric memory cell transistor 30 according to the present invention.

Referring to FIG. 3, the memory cell transistor 30 is constructed on a semiconductor substrate 32 typically formed of Si doped to a first conductivity type, which may be p-type, wherein the substrate 32 is formed with highly doped diffusion regions 32A and 32B of n-type at both lateral sides of a channel region 32C. The channel region 32C of the substrate 32 is covered by an insulation film 33A of $SiO_2$, and a floating gate electrode 33B of Pt, and the like is provided on the insulation film 33A. Further, a ferroelectric film 33C of PZT, and the like, is formed on the floating gate electrode 33B, and a gate electrode 33D of WSi or polysilicon is formed further on the ferroelectric film 33C. While not illustrated, it should be noted that there is further provided with a barrier metal layer of Ti between the ferroelectric film 33C and the polysilicon gate electrode 33D.

It should be noted that the channel region 32C of the memory cell transistor 30 of FIG. 3 is doped to the second conductivity type identical to the conductivity type of the diffusion region 32A or 32B and the transistor 30 operates as a normally-on-mode (depletion-mode) MOSFET in which a current flows always through the channel region 32C.

Further, there are provided a bit line BL and a word line WL in the transistor 30 of FIG. 3 such that the bit line BL is connected to the diffusion region 32A and the word line WL is connected to the gate electrode 33D. Further, a drive line D is connected to the diffusion region 32B.

Figure 4A:
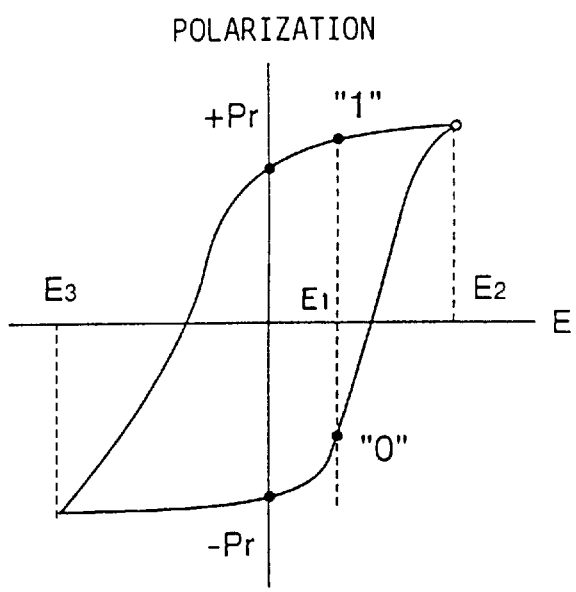
FIGS. 4A and 4B are further diagrams showing the principle of the present invention.

FIG. 4A shows the polarization of the ferroelectric film 33C.

Referring to FIG. 4A, the ferroelectric film 33C has a spontaneous polarization that shows a hysteresis loop with respect to an external electric field E, wherein the hysteresis loop of the ferroelectric film 33C enables the detection of binary information stored in the memory cell transistor 30 by detecting the polarization of the ferroelectric film 33C while applying a predetermined read electric field $E_1$. On the other hand, writing of information "1" into the ferroelectric film 33C is conducted by applying thereto a positive electric field $E_2$ having a magnitude larger than that of the read electric field $E_1$, while writing of information "0" is conducted by applying a negative electric filed $E_3$ to the ferroelectric film 33C with a magnitude larger than the magnitude of the electric field $E_1$.

Figure 4B:
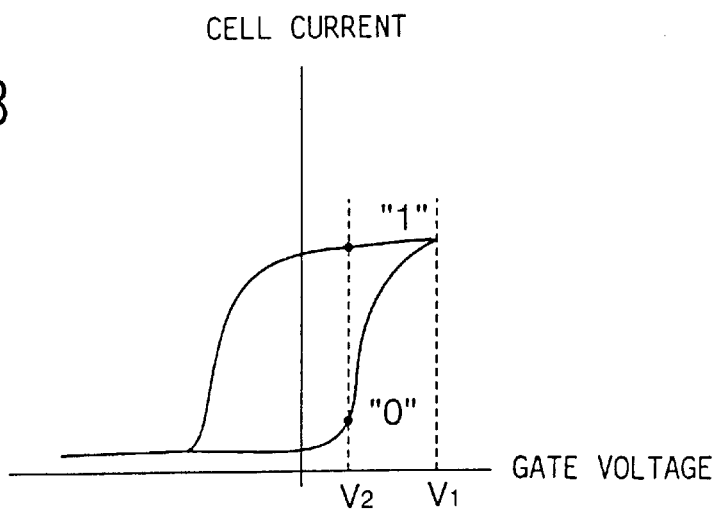

In the memory cell transistor 30 of FIG. 3, the foregoing writing of the information "1" is achieved by applying a positive voltage $V_1$ having a magnitude of the supply voltage to the word line WL as indicated in FIG. 4B and simultaneously grounding the bit line BL and the drive line D. By doing so, the desired positive electric field $E_2$ is applied to the ferroelectric film 33C. As the diffusion region 32A to which the bit line BL is connected is conducted to the diffusion region 32B to which the drive line D is connected, via the channel region 32C, there is induced an electric field between the channel region 32C and the gate electrode 33D, and the electric field thus induced is applied to the ferroelectric film 33C as the writing electric field $E_2$. Similarly, the writing of information "0" is achieved by grounding the word line WL and supplying a positive voltage of the magnitude of the supply voltage to the drive line D and to the bit line BL.

When reading information stored in the memory cell transistor 30, a voltage $V_2$ lower than the foregoing write voltage $V_1$ is applied to the word line WL as indicated in FIG. 4B, and the cell current on the bit line BL is detected by the sense amplifier S/A while supplying the supply voltage to the drive line D. When the stored information is "0," the cell current observed on the bit line BL is small, while a large cell current is observed on the bit line BL when the written information is "1."

As the transistor 30 is a depletion-mode transistor of the normally on type, it should be noted that there flows a non-infinitesimal cell current even when the stored information is "0." Further, the polarity of the voltages explained above is reversed when the transistor 30 is a p-channel depletion mode transistor.

According to the present invention, the channel region of the memory cell transistor is doped to the conductivity type identical to the conductivity type of the first and second diffusion region. Thus, it becomes possible to control the potential of the substrate right underneath the ferroelectric film via the bit line, drive line or the word line, without forming a contact in the well in which the memory cell transistor is formed. Further, it becomes also possible to eliminate the well.

FIRST EMBODIMENT

Figure 5:
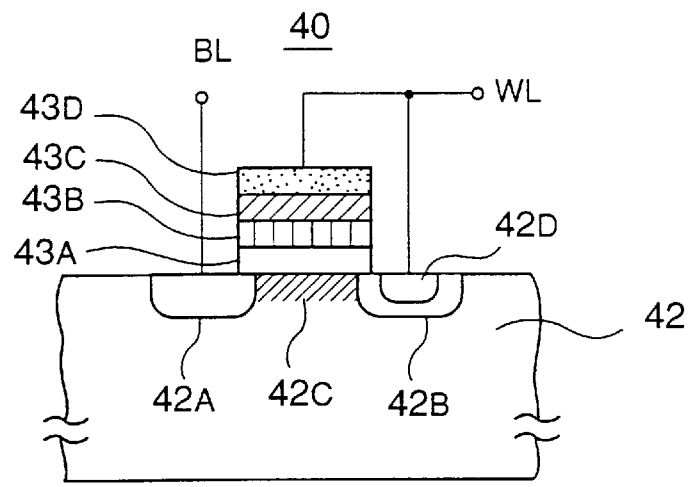
FIG. 5 is a diagram showing the construction of a memory cell transistor used for a non-volatile semiconductor memory device according to a first embodiment of the present invention.

FIG. 5 shows the construction of a ferroelectric memory cell transistor 40 according to a first embodiment of the present invention.

Referring to FIG. 5, the memory cell transistor 40 is constructed on a semiconductor substrate 42 of Si doped to p-type, wherein the substrate 42 is formed with diffusion regions 42A and 42B of $n^+$-type at both lateral sides of a channel region 42C as source and drain regions of the memory cell transistor 40. The channel region 42C is doped to the n-type and is covered by an insulation film 43A of $SiO_2$, and a floating gate electrode 43B of Pt is provided on the insulation film 43A. Further, a ferroelectric film 43C of PZT is formed on the floating gate electrode 43B, and a gate electrode 43D of WSi or polysilicon is formed further on the ferroelectric film 43C. While not illustrated, it should be noted that there is further provided with a barrier metal layer of Ti between the ferroelectric film 43C and the polysilicon gate electrode 43D. In the diffusion region 42B, there is further provided a diffusion region 42D of the p-type, wherein the diffusion regions 42B and 42D form together a diode. In place of providing the diffusion region 42D, it is also possible to form a Schottky electrode. In this case, a Schottky diode is formed in the diffusion region 42B.

Further, there are provided a bit line BL and a word line WL in the transistor 40 of FIG. 5 such that the bit line BL is connected to the diffusion region 42A and the word line WL is connected to the gate electrode 43D. Further, the word line WL is connected also to the diffusion region 42B.

Figure 6:
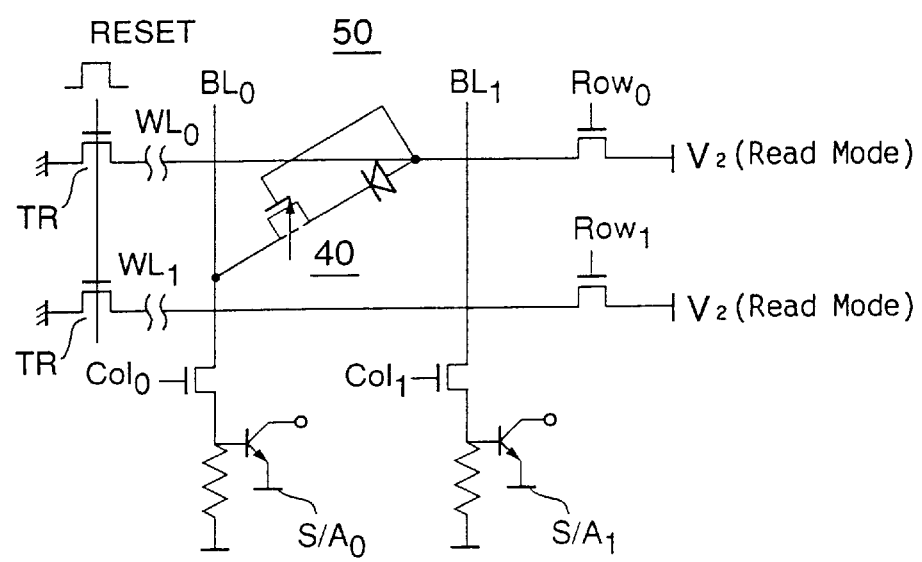
FIG. 6 is a circuit diagram showing the construction of the non-volatile semiconductor memory device that uses the memory cell transistor of FIG. 5.

FIG. 6 shows the construction of a ferroelectric memory device 50 that uses the memory cell transistor 40 of FIG. 5.

Figure 2:
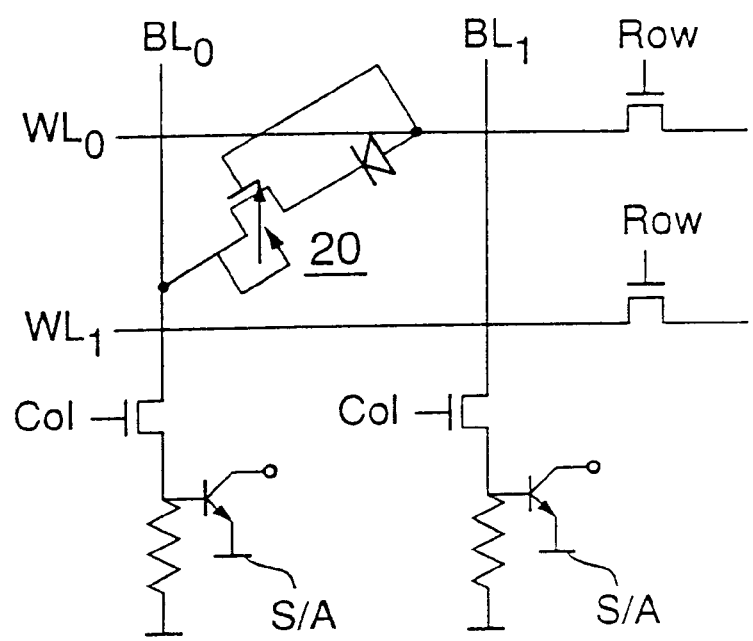
FIG. 2 is a circuit diagram showing the construction of a conventional non-volatile memory device that uses the MFS-FET ferroelectric semiconductor memory device of FIG. 1.

Referring to FIG. 6, the ferroelectric memory device 50 has a construction similar to that of the ferroelectric memory device of FIG. 2, and thus, there is provided a word line $WL_0$ selected by a row selection transistor $Row_0$ such that the word line $WL_0$ is connected to the gate electrode 43D. The word line $WL_0$ is also connected to the diffusion region 42B via the diode formed by the p-type diffusion region 42D. Further, a bit line $BL_0$ is connected to the diffusion region 42A, wherein the bit line $BL_0$ is further connected to a sense amplifier S/A via a column selection transistor $Col_0$. It should be noted that there are provided a word line $WL_1$ and a bit line $BL_1$ adjacent to the word line $WL_0$ and $BL_0$, and a memory cell transistor not shown is connected to the word line $WL_1$ and $BL_1$ similarly to the memory cell transistor 20. It should be noted that the word line $WL_0$ and the word line $WL_1$ are grounded via a transistor TR that turns on in response to a reset pulse.

Figure 1:
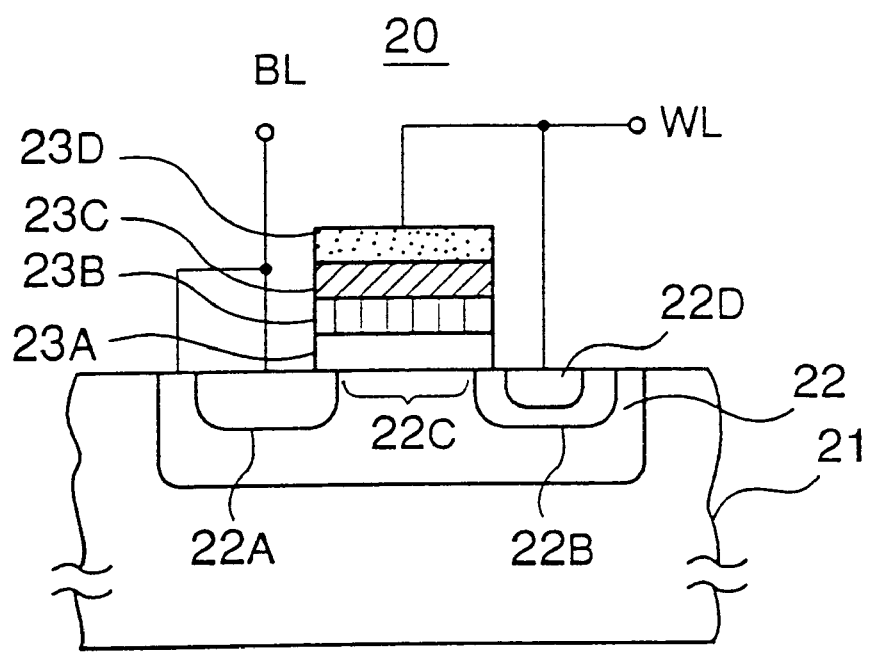
FIG. 1 is a diagram showing the constitution of a conventional MFS-FET ferroelectric semiconductor memory device.

In the construction of FIG. 6, it should be noted that writing of information into the memory cell transistor 40 is conducted by selecting the word line $WL_0$ and the bit line $BL_0$ via the row selection transistor $Row_0$ and the column selection transistor $Col_0$ and by applying a write voltage between the gate electrode 43D and the n-type channel region 42C, which is electrically connected to the $n^+$-type diffusion region 42A. As a result, the information is recorded into the ferroelectric film 43B in the form of spontaneous polarization. In the construction of FIGS. 5 and 6, it is not necessary to control the potential of the well at the time of the writing of information, contrary to the conventional construction of FIGS. 1 and 2. During the foregoing process of writing, the non-selected word lines WL and bit lines BL are held at one-half the voltage $V_1$ which is used for writing, for avoiding the problem of disturb. It should be noted that FIG. 6 shows actually the read mode in which the voltage $V_2$ is supplied to the row selection transistors $Row_0$ and $Row_1$.

When reading information, on the other hand, the word line $WL_0$ is selected by the row selection transistor $Row_0$, and a read voltage is applied to the gate electrode 43D, wherein the read voltage is applied simultaneously to the diffusion region 42B of the memory cell transistor 40 via the diode formed by the diffusion regions 42B and 42D. Thereby, the electric current flowing through the bit line $BL_0$ selected by the column selection transistor $Col_0$, is detected by the sense amplifier S/A cooperating with the bit line $BL_0$. A similar detection is achieved also when the word line $WL_1$ or the bit line $BL_1$ is selected in place of the word line $WL_0$ or the bit line $BL_0$.

As explained already, each of the word lines $WL_0$ and $WL_1$ includes a reset transistor TR that turns on in response to a reset pulse, wherein it should be noted that the reset transistor TR is used to discharge the word line WL prior to the selection thereof. It is possible to use a single-shot pulse that is produced in response to a transition of the address data for the reset pulse. For example, the reset pulse may be the one that is produced by a known ATD (address transition detection) circuit in response to each transition of the address. By providing the reset transistors TR, the conduction of the column selection transistor $Col_0$ occurs always after the discharging of the word line, and the problem of the electric charges on the word line $WL_0$ flowing to the bit line $BL_0$ and causing an erroneous operation in the sense amplifier S/A, is effectively avoided.

Figure 7:
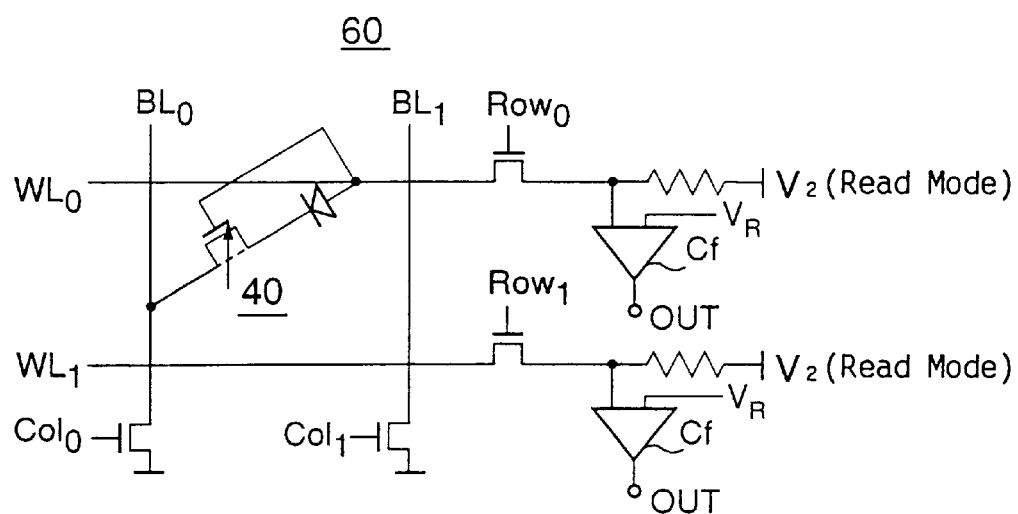
FIG. 7 is a diagram showing a modification of the non-volatile semiconductor memory device of FIG. 6.

FIG. 7 shows the construction of a ferroelectric memory device 60 according to a modification of the circuit of FIG. 6.

Referring to FIG. 7, the ferroelectric memory device 60 has a construction similar to that of the ferroelectric memory device 50, except that the bit lines $BL_0$ and $BL_1$ are grounded via respective column selection transistors $Col_0$ and $Col_1$, and the detection of the current on the bit lines $BL_0$ and $BL_1$ is achieved by detecting a voltage of the corresponding word line $WL_0$ or $WL_1$. For this purpose, the construction of FIG. 7 includes a comparator $C_f$ supplied with a reference voltage $V_R$ wherein the comparator $C_f$ acts as a sense amplifier by comparing the word line voltage with the reference voltage $V_R$. In the construction of FIG. 7, in which the word line voltage is detected directly by the comparator, it is possible to eliminate the word line discharging transistor TR used in the construction of FIG. 6.

Again, FIG. 7 shows the read mode operation in which the voltage $V_2$ is applied to the row selection transistors $Row_0$ and $Row_1$ via respective resistors.

SECOND EMBODIMENT

The ferroelectric memory device of the present invention is a non-volatile memory and can replace an EEPROM or a flash memory. In the case of using the ferroelectric memory of the present invention for a flash memory, which is characterized by a flash erasing of information, on the other hand, it is necessary to provide an adaptation of the circuit for realizing such a flash erasing of information also in the ferroelectric memory.

Figure 8:
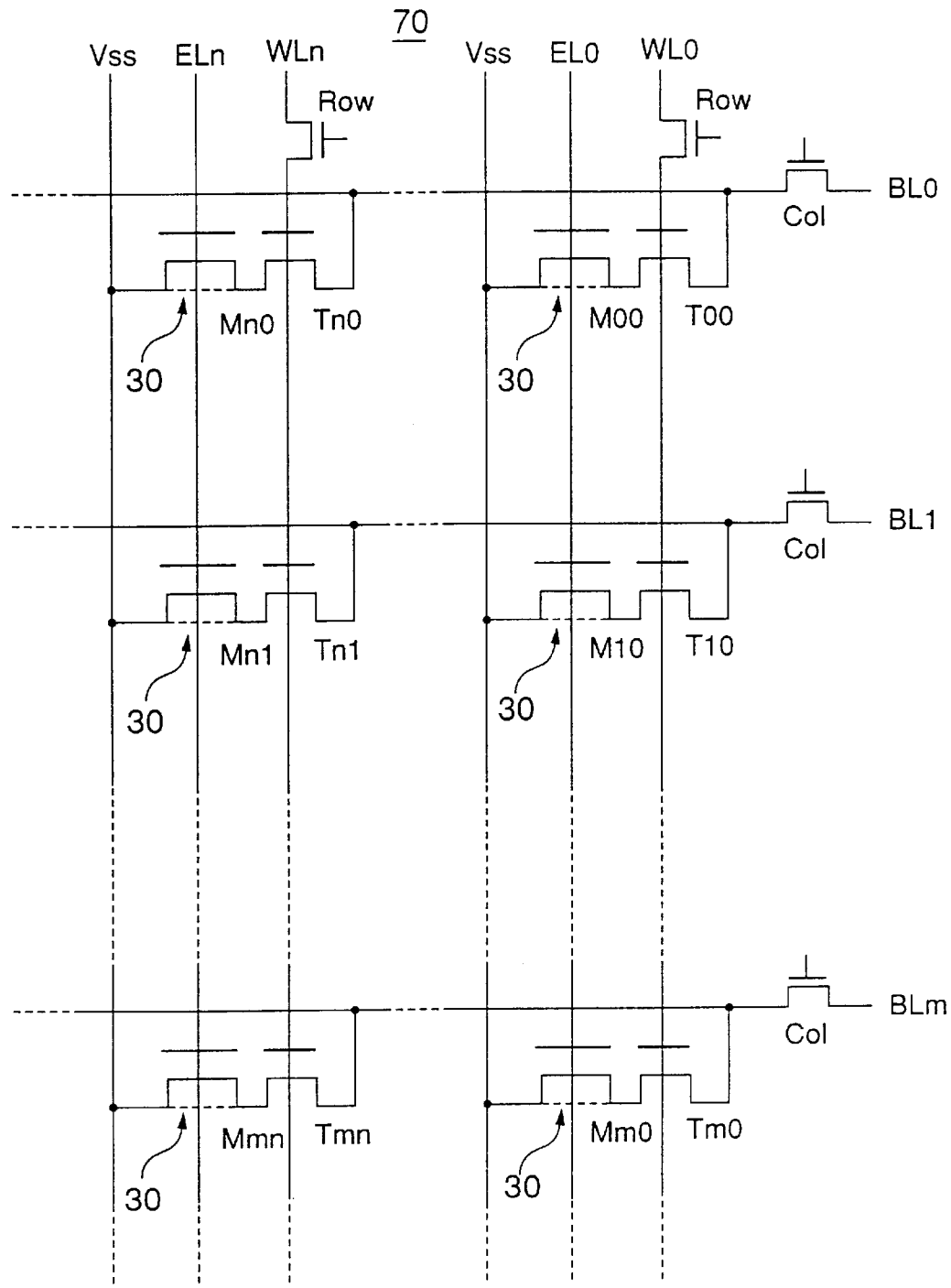
FIG. 8 is a circuit diagram showing the construction of a flash memory according to a second embodiment of the present invention.

FIG. 8 shows an example of a non-volatile semiconductor memory device 70 that uses the ferroelectric memory cell transistor 40 of FIG. 5 and realizes a flash erasing of information.

Referring to FIG. 8, the non-volatile semiconductor memory device 70 includes a memory cell in correspondence to each of the intersections of bit lines $BL_0$ - $BL_m$ and word lines $WL_0$ - $WL_n$, wherein each memory cell includes a ferroelectric memory cell transistor $M_{mn}$ having the construction of FIG. 3 and a selection MOS transistor $T_{mn}$ connected in series between a supply line $V_{ss}$ and a corresponding bit line. In the memory cell connected to the bit line $BL_0$ and the word line $WL_0$, for example, a ferroelectric memory cell transistor $M_{00}$ and a selection MOS transistor $T_{00}$ are connected in series between the power supply line $V_{ss}$ and the bit line $BL_0$. Hereinafter, the description will be made only for the memory cell connected to the bit line $BL_0$ and the word line $WL_0$. It should be noted, however, that the same description applies also to other memory cells.

It should be noted that the selection MOS transistor $T_{00}$ is selected by the word line $WL_0$ and connects the bit line $BL_0$ to the ferroelectric memory cell transistor $M_{00}$. Further, it should be noted that an erase control line $EL_0$ is connected to the gate electrode 33D of the ferroelectric memory cell transistor $M_{00}$ (see FIG. 3).

Thus, in an erase mode operation, a supply voltage $V_{cc}$ is supplied to the erase control lines $EL_0$ - $EL_n$, and there is induced an erase electric field between the channel region 32C and the gate electrode, to which the supply voltage $V_{cc}$ is supplied via the erase control line $EL_0$, for the memory cell transistor $M_{00}$ as well as for all the memory cell transistors $M_{mn}$ connected to the supply voltage $V_{ss}$. As a result, the polarization of the ferroelectric film 33C is set to the state "1" for all the memory cell transistors $M_{00}$ - $M_{mn}$.

In a write mode operation for writing information into the memory cell transistor $M_{00}$, the erase control line $EL_0$ is grounded and the write data is set on the bit line $BL_0$. Further, the transistor $T_{00}$ is turned on in this state by selecting the word line $WL_0$. When the data to be written is "1," a 0V voltage is supplied to the bit line $BL_0$, while a supply voltage $V_{cc}$ is supplied to the bit line $BL_0$ when writing data "0."

In the case the data to be written is "1," no electric field is applied across the n-type channel region 32C and the gate electrode 33D of the ferroelectric memory cell transistor 30 of FIG. 3, and the polarization of the ferroelectric film 33C does not change from the initial state "1." On the other hand, when the data to be written is "0," an electric field is applied between the n-type channel region 32C and the gate electrode 33D such that the polarization in the ferroelectric film 33C is reversed.

In order that such a reversal of polarization of the ferroelectric film 33C occurs in the foregoing write mode operation, it is essential that the channel region 32C of the transistor 30 is doped to have the conductivity of the n-type. In a hypothetical case in which no such a doping is made to the channel region 32C, only the erase operation is possible. In the write mode operation, in which the voltage applied to the gate electrode 33D is 0V, no voltage is applied to the channel region 32C and the desired reversal of polarization of the ferroelectric film 33C is not caused.

During the foregoing write mode operation, it should be noted that the non-selected bit lines $BL_1$ - $BL_m$ are held at the 0V level and no writing of information is made into the non-selected memory cell transistors $M_{10}$ - $M_{m0}$ that are connected to the selected word line $WL_0$.

In a read mode operation for reading data from the memory cell transistor 30, the word line $WL_0$ and the bit line $BL_0$ are selected and the selection transistor $T_{00}$ is turned on. Further, a read voltage of about 1.5V is applied to the selected bit line $BL_0$. As a result, the cell current flowing through the transistor $M_{00}$ is changed in correspondence to the polarization of the ferroelectric film 33C of the memory cell transistor $M_{00}$, and this change of the cell current appears as a change of current of the bit line $BL_0$, wherein such a change of the current on the bit line $BL_0$ is detected by using the sense amplifier S/A. During the read mode operation, the erase control lines $EL_0$ - $EL_n$ are grounded.

In the ferroelectric memory device 70 of FIG. 8, it should be noted that a flash erasing of information is made by using the erase control lines $EL_0$ - $EL_n$. Further, a random accessing becomes possible by using the selection transistors $T_{00}$ - $T_{mn}$.

THIRD EMBODIMENT

Figure 9:
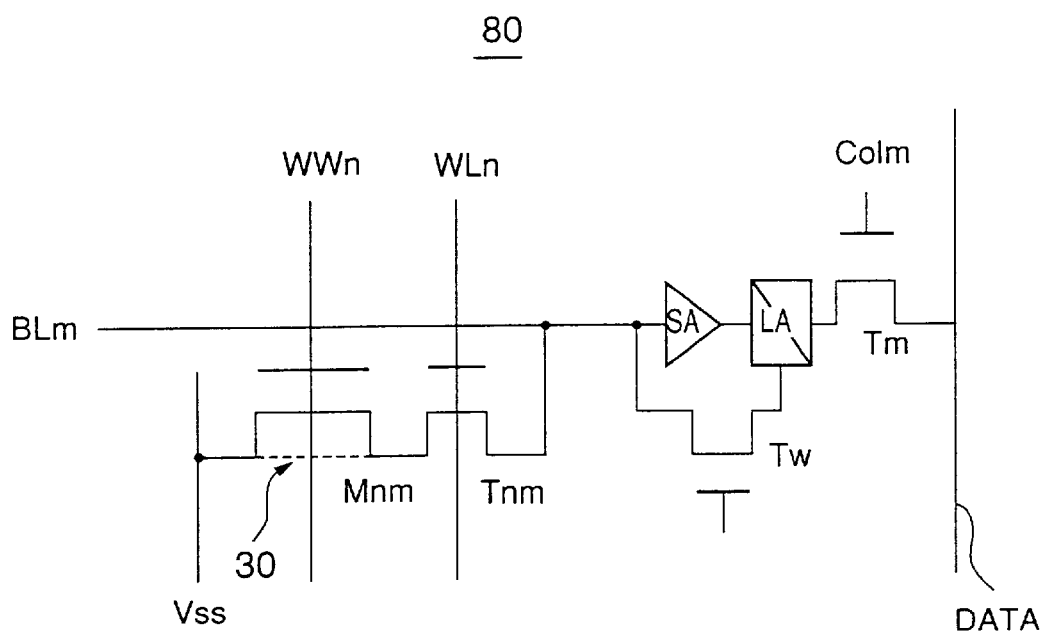
FIG. 9 is a circuit diagram showing the construction of a non-volatile random access memory according to a third embodiment of the present invention.

FIG. 9 shows the construction of a nonvolatile random access memory 80 constructed by using the ferroelectric memory cell 30.

Referring to FIG. 9, it should be noted that the random access memory 80 includes a plurality of memory cells in correspondence to the combination of the word lines $WL_0$ - $WL_n$ and the bit lines $BL_0$ - $BL_m$ similarly to the flash memory 70 of FIG. 8, wherein FIG. 9 shows only the memory cell that is connected to the word line $WL_n$ and the bit line $BL_m$.

As indicated in FIG. 9, the memory cell includes a memory cell transistor $M_{mn}$ having the construction identical to the ferroelectric memory cell transistor 30 of FIG. 3 and a selection transistor $T_{mn}$ connected in series between the power supply line $V_{ss}$ and the bit line $BL_m$, wherein the selection transistor $T_{mn}$ is connected to the word line $WL_n$. Further, the gate electrode 33D of the memory cell transistor $M_{mn}$ is connected to a write control line $WW_n$.

Further, the construction of FIG. 9 includes a sense amplifier S/A and a data latch circuit LA connected to the bit line $BL_m$, wherein the data latch circuit LA holds the data detected by the sense amplifier S/A. Further, there is provided a transfer transistor TW used for returning the data held on the latch circuit LA to the bit line $BL_m$.

In a normal read mode operation, the word line $WL_n$ and the bit line $BL_m$ are selected and the selection transistor $T_{mn}$ is turned on. In the foregoing normal read mode operation, the write control line $WW_n$ is set to the ground level and a current corresponding to the direction of polarization of the ferroelectric film 33C is caused to flow through the memory cell transistor $M_{mn}$. The cell current in turn causes a change in the bit line current in the bit line $BL_m$ and the sense amplifier S/A detects the foregoing bit line current on the bit line $BL_m$. The output of the sense amplifier S/A is held by the latch circuit LA and is supplied to a data bus DATA via a column selection transistor $Col_m$.

In a write mode operation, the read mode operation described above is conducted for all the memory cells connected to the word line $WL_n$. Thereby, the information "0" or "1" thus read out is held by the respective latch circuits LA.

Next, the selection transistor $T_{mn}$ is turned off by grounding the word line $WL_n$, and new information is written into the latch circuit LA corresponding to the memory cell to which the new information is to be written, from the data bus DATA via the column selection transistor $Col_m$.

Next, while maintaining the turned-off state of the selection transistor $T_{mn}$, a positive voltage pulse of the supply voltage $V_{cc}$ is supplied to the write control line $WW_n$ so as to erase the information from all the memory cell transistors $M_{mn}$ connected to the write control line $WW_n$. Thereby, the information held in the memory cell transistors $M_{mn}$ connected to the write control line $WW_n$ are all set to "1."

Next, the write control line $WW_n$ is grounded and the word line $WL_n$ is activated such that all the memory cell transistors $M_{mn}$ connected to the foregoing word line $WL_n$ are selected. Further, the data held in the latch circuits LA are transferred to the corresponding memory cell transistors $M_{mn}$ for all the bit lines $BL_m$ via the selection transistors $T_{mn}$, by conducting the transfer transistors TW for all of the bit lines $BL_m$. The writing into the memory cell transistor $M_{mn}$ is achieved similarly to the memory cell transistor $M_{00}$ of the flash memory 70 of FIG. 8.

It should be noted that the device 80 of FIG. 9 functions as a non-volatile random access memory.

Further, the present invention is by no means limited to the embodiments described heretofore, but various variations and modifications may be made without departing from the scope of the present invention.

What is claimed is:

1. A ferroelectric memory device, comprising:
   a substrate having a first conductivity type;
   a channel region formed in said substrate;
   a first diffusion region formed in said substrate at a first side of said channel region, said first diffusion region having a second, opposite conductivity type;
   a second diffusion region formed in said substrate at a second side of said channel region, said second diffusion region having said second conductivity type;
   a ferroelectric film formed on said substrate so as to cover said channel region; and
   a gate electrode provided on said ferroelectric film;
   wherein said channel region has said second conductivity type.

2. A ferroelectric memory device as claimed in claim 1, further comprising a $SiO_2$ film and a floating gate between said ferroelectric film and said substrate.

3. A ferroelectric memory device as claimed in claim 1, wherein said second diffusion region includes therein a further diffusion region of said first conductivity type.

4. A ferroelectric memory device as claimed in claim 1, further including a word line connected to said gate electrode, a bit line connected to said first diffusion region, and a drive line connected to said second diffusion region.

5. A ferroelectric memory device as claimed in claim 4, wherein said second diffusion region includes therein a third diffusion region of said first conductivity type, and wherein said drive line connects said third diffusion region to said word line.

6. A ferroelectric memory device as claimed in claim 4, further including a sense amplifier connected to said bit line via a bit line selection switch and a reset transistor connected to said word line, said reset transistor being turned on in response to a reset pulse.

7. A ferroelectric memory device as claimed in claim 4, further including a discrimination circuit connected to said word line, said discrimination circuit discriminating information stored in said ferroelectric film of said memory cell transistor by comparing a word line voltage with a reference voltage.

8. A ferroelectric memory device, comprising:
   a plurality of word lines;
   a plurality of bit lines; and
   a plurality of memory cell transistors, each connected to a word line and a bit line, each of said memory cell transistors comprising: a substrate having a first conductivity type; a channel region formed in said substrate; a first diffusion region formed in said substrate at a first side of said channel region, said first diffusion region having a second, opposite conductivity type; a second diffusion region formed in said substrate at a second side of said channel region, said second diffusion region having said second conductivity type; a ferroelectric film formed on said substrate so as to cover said channel region; and a gate electrode provided on said ferroelectric film; said channel region having said second conductivity type,
   wherein said word line is connected to said gate electrode and said bit line is connected to said first diffusion region, said second diffusion region is electrically connected to said word line.

9. A ferroelectric memory device as claimed in claim 8, wherein each of said memory cell transistors includes a third diffusion region in said second diffusion region, and wherein said third diffusion region is connected to said word line.

* * * * *